United States Patent [19]

Takebuchi

[11] Patent Number: 5,151,761
[45] Date of Patent: Sep. 29, 1992

[54] NONVOLATILE SEMICONDUCTOR MEMORY DEVICE WITH ISOLATED GATE ELECTRODES

[75] Inventor: Masataka Takebuchi, Yokohama, Japan

[73] Assignee: Kabushiki Kaisha Toshiba, Kawasaki, Japan

[21] Appl. No.: 627,846

[22] Filed: Dec. 14, 1990

[30] Foreign Application Priority Data

Dec. 15, 1989 [JP] Japan ................................. 1-325395

[51] Int. Cl.⁵ ..................... H01L 29/68; H01L 23/48; H01L 29/46
[52] U.S. Cl. .................................... 357/23.5; 357/68; 357/71
[58] Field of Search .......................... 357/23.5, 68, 71; 365/185

[56] References Cited

U.S. PATENT DOCUMENTS

| | | | |
|---|---|---|---|
| 4,543,592 | 9/1985 | Itsumi et al. | 357/71 |
| 4,598,460 | 7/1990 | Owens et al. | 357/42 |
| 4,935,378 | 6/1990 | Mori | 357/71 |
| 5,023,680 | 6/1991 | Gill et al. | 357/23.5 |

FOREIGN PATENT DOCUMENTS 0236676 9/1987 European Pat. Off.
0258141 3/1988 European Pat. Off.

OTHER PUBLICATIONS

Patent Abstracts of Japan, vol. 13, No. 97 (E-723)7 Mar. 1989 & JP-A-63 271 971 (Matsushita).

*Primary Examiner*—Rolf Hille
*Assistant Examiner*—Robert Limanek
*Attorney, Agent, or Firm*—Finnegan, Henderson, Farabow, Garrett and Dunner

[57] ABSTRACT

A nonvolatile semiconductor memory device is disclosed, which includes a semiconductor substrate, a field oxidation film selectively formed on the semiconductor substrate, a first gate insulating film formed on an exposed surface of the semiconductor substrate and on the field oxidation film, a plurality of memory cells, floating gate electrodes and control gate electrodes of the plurality of memory cells, the floating gate and the control gate of each of the memory cells being isolated from those of other adjacent memory cells so as to be formed into an island, an insulating interlayer formed on the field oxidation film and on the control gate electrode, a contact hole extending through the first insulating interlayer so as to expose a portion of the control gate electrode, and a plurality of wires, formed on the insulating interlayer, for connecting the control gate electrodes of memory cells of the plurality of memory cells, which are adjacent to each other in a word line direction, through the first contact hole.

28 Claims, 17 Drawing Sheets

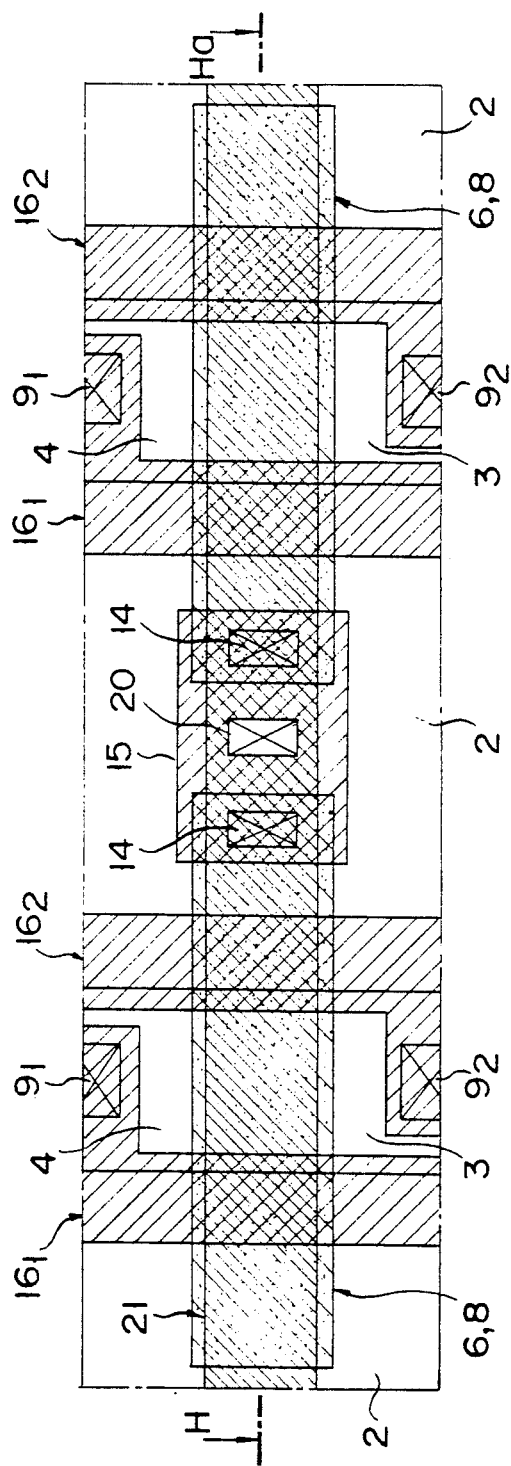
F I G. 19
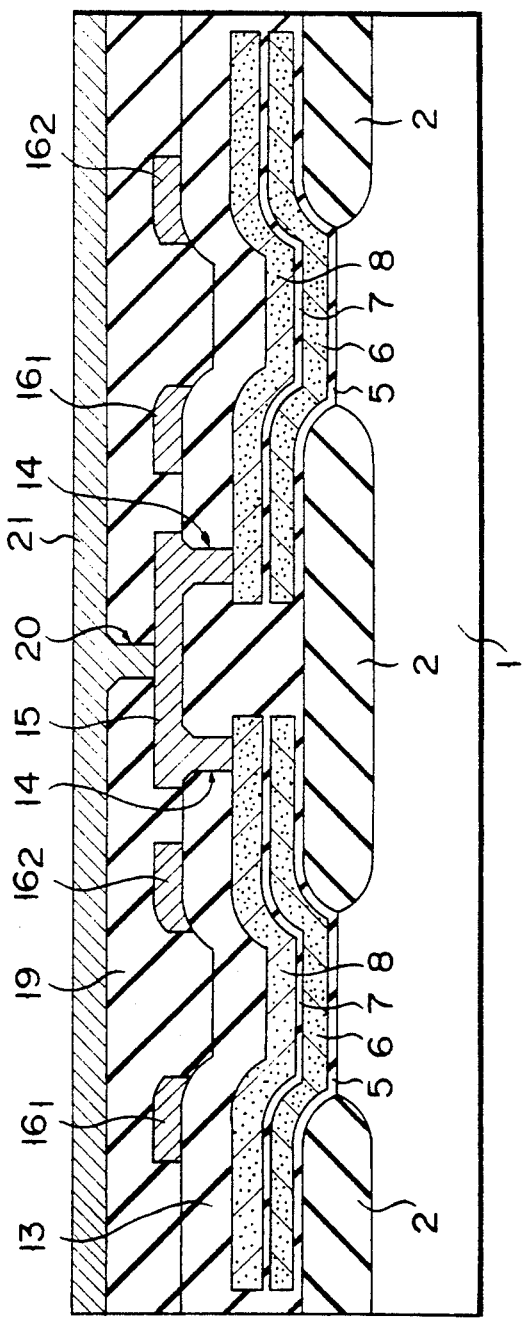
F I G. 20

NONVOLATILE SEMICONDUCTOR MEMORY DEVICE WITH ISOLATED GATE ELECTRODES

BACKGROUND OF THE INVENTION

1. Field of the Invention

The present invention relates to a nonvolatile semiconductor memory device and the manufacture thereof and, more particularly, to a nonvolatile semiconductor memory device having a memory transistor constituted by a floating gate electrode and a control gate electrode and a method of manufacturing the same.

2. Description of the Related Art

EPROMs and E$^2$PROMs are well known as nonvolatile semiconductor memory devices capable of rewriting storage data.

EPROMs and E$^2$PROMs have memory transistors, each constituted by a floating gate electrode in an electrically floating state and a floating gate electrode functioning as a word line, in their memory cell portions. Storage data is determined by the charge state of each floating gate electrode and is replaced with storage data of "1" or "0" in accordance with the ON/OFF state of the corresponding memory transistor.

Floating gate electrodes and control gate electrodes are formed by the following method. A first polysilicon layer is deposited on a first gate insulating film. Cell slits are formed in the first polysilicon layer to isolate floating gate electrodes in units of memory cells. A second gate insulating film is formed on the resultant structure, and a second polysilicon layer subsequently is deposited. The second polysilicon layer is then patterned in the form of a word line by using a photoresist. At the same time, the first polysilicon layer is etched in a self-aligned manner by using this photoresist with the form of a word line, thus forming floating gate electrodes isolated in units of memory cells (a conventional EPROM).

A method of forming floating electrodes to be self-aligned with a word line in the above-described manner has generally been employed.

In addition, a word line also serves as a control gate electrode in each memory cell.

FIGS. 1 and 2 are plan and sectional views in a process in which floating gates are formed in a self-aligned manner with respect to a word line. FIG. 2 is a sectional view taken along a line M—Ma in FIG. 1.

As shown in FIGS. 1 and 2, field oxidation films 2 are formed on the upper surface of a substrate 1. Referring to FIGS. 1 and 2, reference numeral 3 denotes source regions; and 4, drain regions. Floating gate electrodes 6 are formed between these regions through first gate insulating films 5. The floating gate electrodes 6 are formed to be isolated from each other in units of memory cells. A word line 8 is formed on the floating gate electrodes 6 through second gate insulating films 7. This word line 8 extends over the respective memory cells adjacent to each other in the channel width direction and serves as a control gate electrode in each memory cell. Reference numeral 9 denotes contact hole regions with respect to the drain regions.

Drawbacks of this conventional structure will be described below.

The first drawback of the conventional structure is that the breakdown voltage of the second gate insulating film 7 between the control gate electrode (word line) 8 and the floating gate electrode 6 is decreased.

This problem is posed because the second gate insulating films 7 are formed in a state wherein cell slits 10 are formed to isolate the floating gate electrodes 6 from each other, which are formed by the first polysilicon layer on the memory cells adjacent to each other in the column direction.

More specifically, if oxidation is performed while the cell slits 10 are formed, since the oxidation rate of a corner portion, of the first polysilicon layer, indicated by a circle 11 in FIG. 2 is lower than that of a flat portion, the second gate insulating film 7 formed in the corner portion is thinner than that formed on the flat portion.

In addition, with this decrease in film thickness, an electric field tends to concentrate on the corner portion of the floating gate electrode 6 since the corner portion is a projection.

The above-described two points synergistically act to decrease the breakdown voltage of the second gate insulating film 7. Especially, the electric field concentration at the corner portion of the floating gate electrode 6 causes a considerable decrease in breakdown voltage because the control gate electrode 8 is arranged to oppose the floating gate electrode 6.

Once a breakdown of the second insulating film 7 occurs, the control gate electrode 8 and the floating gate electrode 6 are electrically connected to each other. As a result, the potential of the control gate electrode 6 is directly applied to the first gate insulating film 5.

The degree of damage to the first gate insulating film 5 varies depending on its thickness. In an E$^2$PROM including a tunnel insulating film having a thickness of, e.g., 100 Å or less, the damage to this tunnel insulating film is great.

In an E$^2$PROM, if a breakdown of a second gate insulating film occurs, a voltage (e.g., about 20 V) applied to a control gate electrode is directly applied to a tunnel insulating film. The tunnel insulating film is then broken down. As a result, the control gate (word line) and a substrate are short-circuited. If a short circuit of the control gate electrode (word line) and the substrate occurs, the damage caused by the breakdown of the second gate insulating film is not limited to only one bit and memory cells corresponding to one word line, e.g., eight bits, i.e., one byte, cannot perform write and erase operations any longer.

As described above, in a nonvolatile semiconductor memory device incorporating memory cells each consisting of a floating gate and a control gate, one defect may cause a large number of defects. Therefore, each element must be produced in strict conditions.

The second drawback of the conventional structure is associated with the process of forming the cell slits 10 in the first polysilicon layer so as to isolate the floating gate electrodes 6, of the memory cells adjacent to each other in the column direction, from each other.

In the process in question, the first polysilicon layer is partially etched to form the cell slits 10. The problem is that after the second gate insulating film 7 is formed by thermal oxidation of the first polysilicon layer, the second polysilicon layer, the second gate insulating film 7, and the first polysilicon layer are simultaneously etched to pattern a word line and floating gates.

In such a process, no first polysilicon layer is left in the regions where the cell slits 10 are formed. In a region where the cell slit 10 is formed and no word line 8 is present, the field oxidation film 2 is locally reduced in thickness. This region where the decrease in film thickness occurs is denoted by reference numeral 12 in FIG. 1.

More specifically, in this thickness-reduced region 12, when the second gate insulating film 7 and the floating gate electrode 6 (first polysilicon layer) are partially etched, the upper surface of the field oxidation film 2 is also etched to cause a great reduction in film thickness of the film 2.

In the worst case, the thickness of the field oxidation film 2 in the thickness-reduced region 12 is reduced to about ⅓ the initial film thickness.

This reduction of thickness, if occurs, the elements cannot be electrically isolated completely.

The above-described two drawbacks may be temporarily eliminated by stricter manufacturing process management. However, fundamental measures are required, for the future, in terms of a nonvolatile semiconductor memory device and a method of manufacturing the same.

SUMMARY OF THE INVENTION

It is an object of the present invention to provide a nonvolatile semiconductor memory device and a method of manufacturing the same, in which a second gate insulating film between a control gate electrode and a floating gate electrode is improved in quality, and a local reduction in thickness of a field insulating film can be prevented.

According to the present invention, there is provided a nonvolatile semiconductor memory device including a plurality of memory cells, each consisting of a floating gate formed on a semiconductor substrate through a first insulating film, and a control gate formed on the floating gate through a second insulating film so as to be capacitively coupled to the floating gate, the memory cells being integrated in the form of a matrix, and the integrated memory cells having bit lines in a column direction and word lines in a row direction, comprising:

the control gates isolated from each other and formed into islands in units of memory cells;

a first insulating interlayer covering an entire upper surface of the resultant structure:

first contact holes extending through the first insulating interlayer to reach the control gates; and first wires for connecting the control gates of adjacent memory cells, of the plurality of memory cells, which are adjacent to each other in the row direction, through the first contact holes.

According to the present invention, there is provided a method of manufacturing a nonvolatile semiconductor memory device, comprising the steps of:

forming a first gate insulating film on a semiconductor substrate;

forming a first conductive layer on the first gate insulating film;

forming a second insulating film on the first conductive layer;

forming a second conductive layer on the second gate insulating film;

forming the control gates and the floating gates into islands in units of memory cells by collectively patterning the second conductive layer, the second gate insulating film, and the first conductive layer;

forming a first insulating interlayer on an entire upper surface of the resultant structure;

forming first contact holes extending through the first insulating interlayer and reaching the control gates;

forming a third conductive layer on an entire upper surface of the resultant structure; and patterning the third conductive layer to form first wires for connecting control gates of the control gates of the memory cells, which are adjacent to each other in the row direction, to each other through the first contact holes.

According to the above-described nonvolatile semiconductor memory device and a method of manufacturing the same, no cell slits are formed in the first conductive layer. Since the second insulating film is formed on the very flat first conductive layer, a second gate insulating film having a locally reduced thickness is rarely formed.

In addition, since the first and second conductive layers are patterned into floating gate electrodes and control gate electrodes in the same patterning process, no portions of the field insulating films are overetched, thus preventing a reduction in thickness of each field insulating film.

In terms of a structure, since the control gate electrodes are formed on only the floating gate electrodes, no corners of the floating gate electrodes oppose the control gates. Therefore, no breakdown of the second gate insulating films due to local electric field concentration occurs.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 19 is a plan view showing a pattern of an EPROM according to the sixth embodiment of the present invention;

FIG. 20 is a sectional view taken along a line H—Ha in FIG. 19;

DETAILED DESCRIPTION OF THE PREFERRED EMBODIMENTS

Nonvolatile semiconductor memory devices and methods of manufacturing the same according to embodiments of the present invention will be described below with reference to the accompanying drawings.

Figure 1:
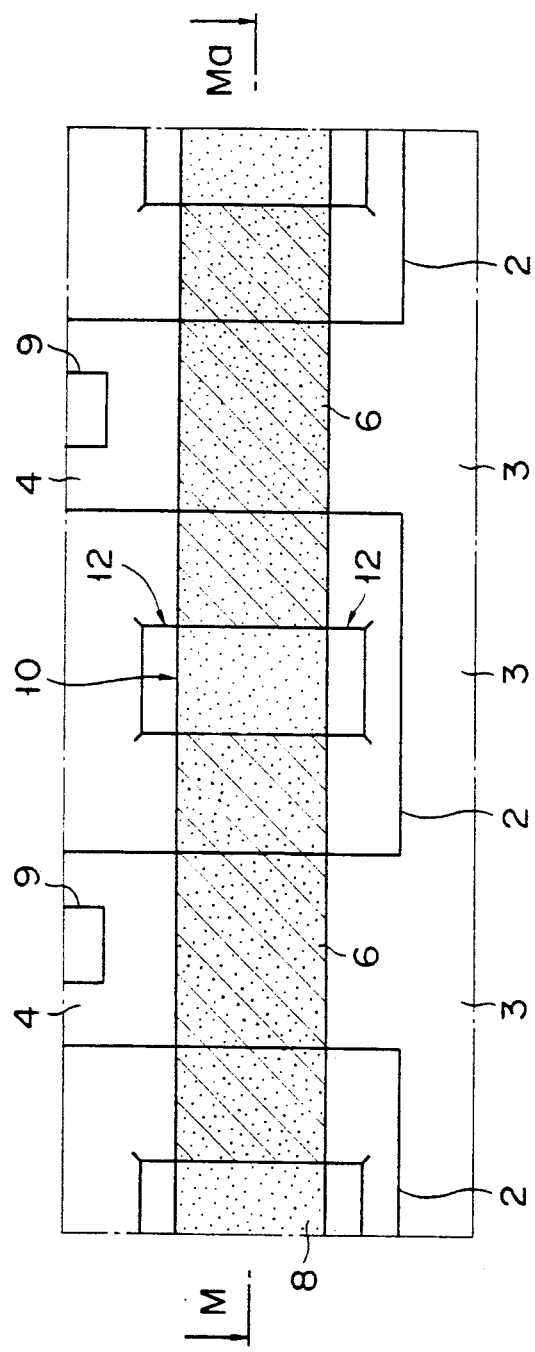
FIGS. 1 and 2 are plan and sectional views of a conventional nonvolatile semiconductor memory device.
Figure 2:
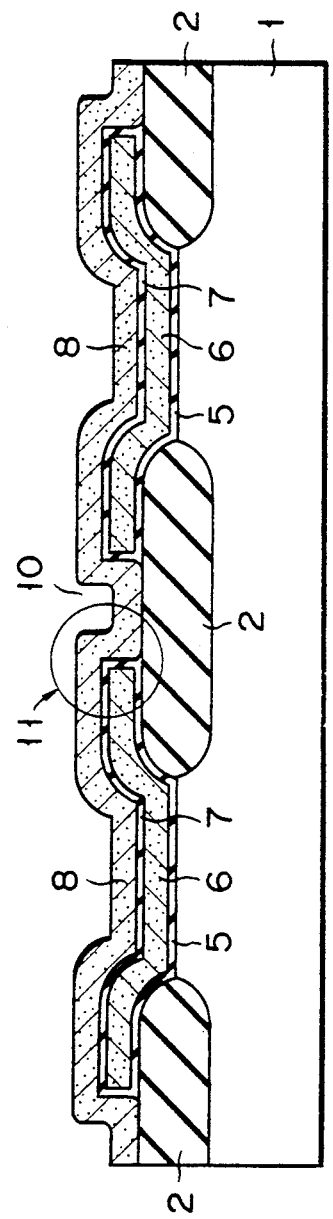
Figure 3:
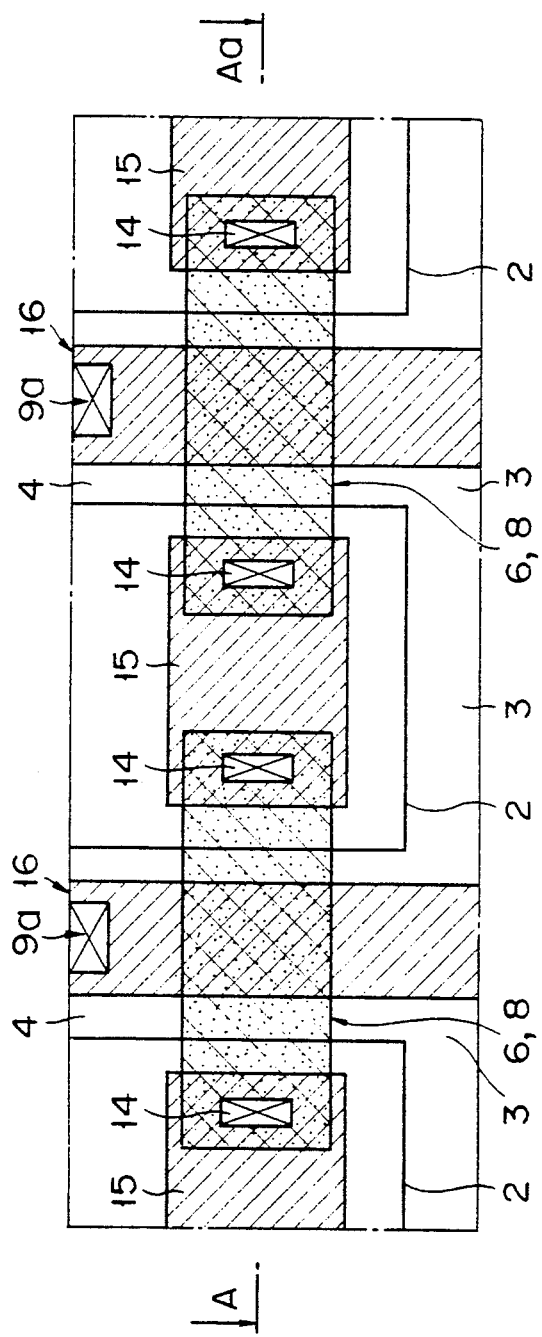
FIG. 3 is a plan view showing a pattern of an EPROM according to the first embodiment of the present invention.
Figure 4:
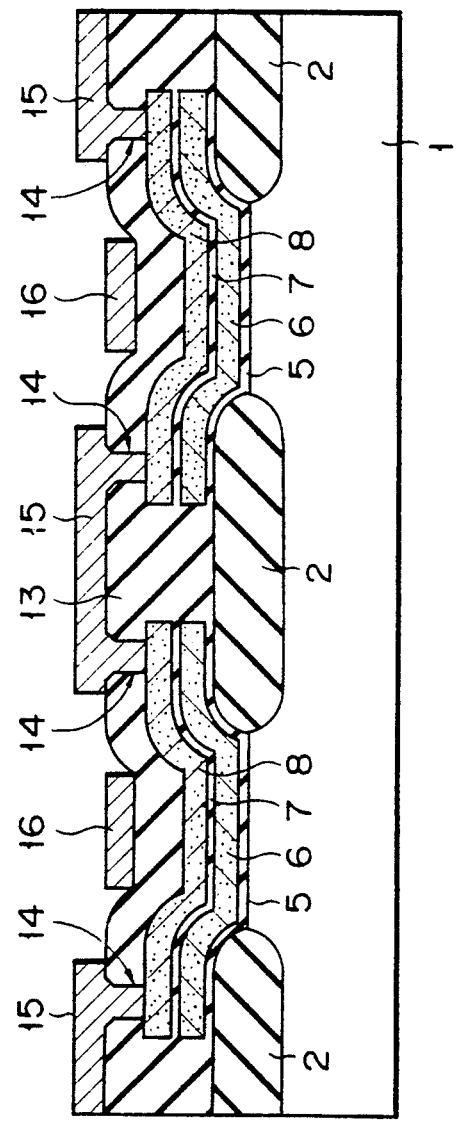
FIG. 4 is a sectional view taken along a line A—Aa in FIG. 3.

FIG. 3 is a plan view showing a pattern of a two-bit memory cell portion of an EPROM according to the first embodiment of the present invention. FIG. 4 is a sectional view taken along a line A—Aa in FIG. 3. The same reference numerals in FIGS. 3 and 4 denote the same parts as in FIGS. 1 and 2 showing the conventional device, and a description thereof will be omitted.

As shown in FIGS. 3 and 4, the present invention is characterized in that control gate electrodes 8 are isolated from each other in units of memory cells, similar to floating gate electrodes 6.

Referring to FIGS. 3 and 4, contact holes 14 communicating with the respective control gate electrodes 8 are formed in insulating interlayers 13. Wires 15 are arranged through these contact holes 14 so as to connect the control gate electrodes 8 adjacent to each other in the word line direction, i.e., the channel width direction. With this arrangement, even though the control gate electrodes 8 of the adjacent memory cells are isolated from each other in units of memory cells, since the control gate electrodes 8 adjacent to each other in the word line direction are connected to each other through the wires 15, the control gate electrodes 8 can also serve as a word line.

Note that reference numeral 16 denotes bit lines which are made of the same conductive layer as a layer for the wires 15 (which will be described later). Reference numeral 9a denotes contact portions of the bit lines 16.

An effect associated with an increase in breakdown voltage of a second gate insulating film of the device according to the first embodiment of the present invention will be described below with reference to FIG. 5.

Figure 5:
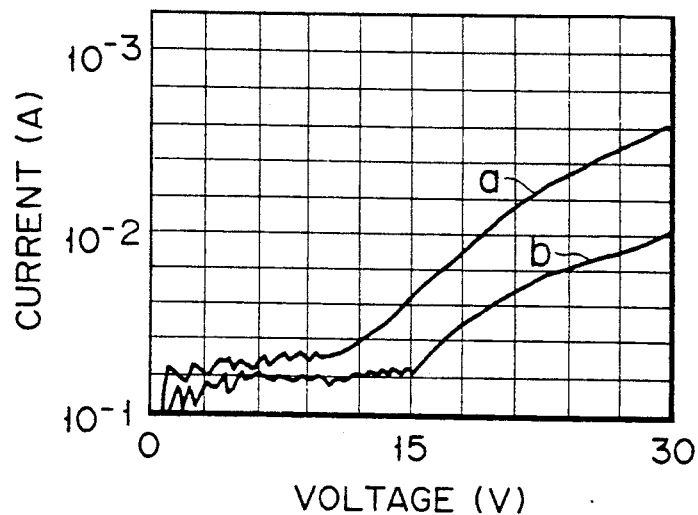
FIG. 5 is a graph showing correlations between voltages applied to control gates and control gate/floating gate currents in the memory device of the present invention and in the conventional memory device.

FIG. 5 is a graph showing correlations between voltages applied to control gates and weak control gate/floating gate currents flowing in second gate insulating films.

Referring to FIG. 5, a curve a is a second gate insulating film breakdown characteristic curve in a conventional device (see FIGS. 1 and 2), whereas a curve b is a second gate insulating film characteristic curve in a device of the present invention (see FIGS. 3 and 4).

When the curves a and b are plotted on the same graph as shown in FIG. 5, it is apparent that the curve b associated with the present invention is located below the curve a and hence indicates that the control gate/floating gate current is smaller in amount than that in the conventional device.

In addition, it is apparent that when the voltages applied to the control gates become about 12 V or more, the difference between the curves a and b is further increased. This indicates that a large control gate electrode/floating gate electrode current flows in the conventional device, but a control gate electrode/floating gate electrode current is suppressed in the device of the present invention.

As described above, in the device of the present invention, the breakdown voltage of a second gate insulating film is increased.

A method of manufacturing the device according to the first embodiment of the present invention will be described below with reference to FIGS. 6A to 6C.

Figure 6A:
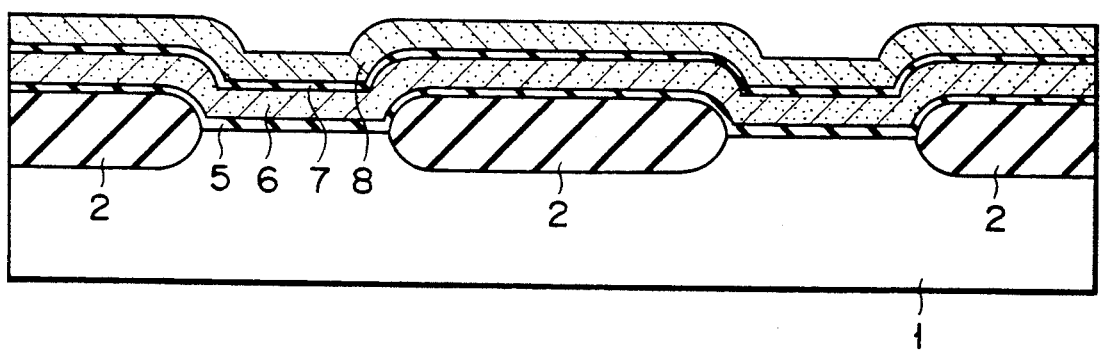
FIG. 6A to 6C are sectional views showing the device according to the first embodiment in the order of manufacturing steps.
Figure 6B:
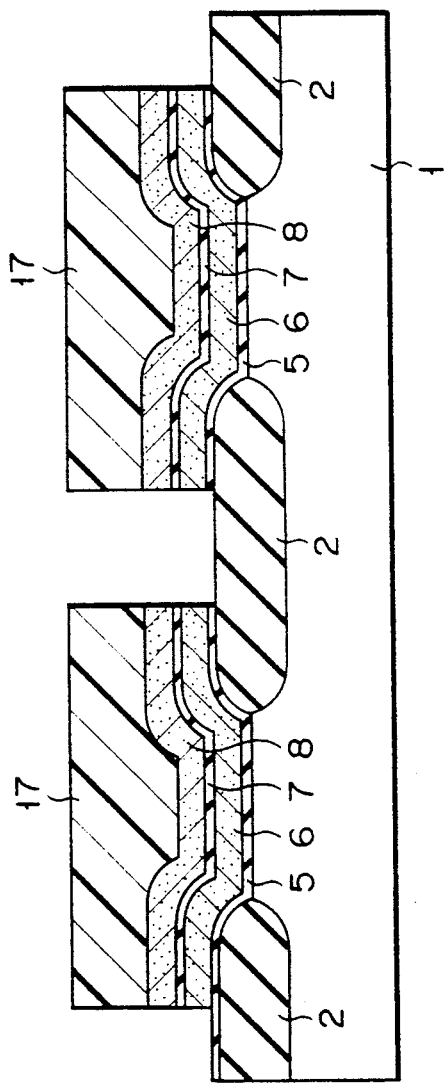
Figure 6C:
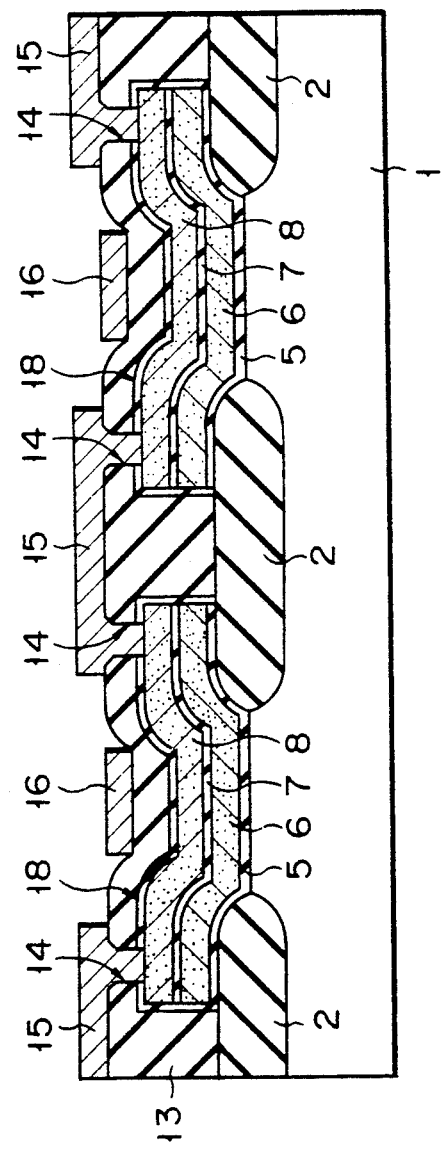

FIGS. 6A to 6C are sectional views showing the same cross-section as that shown in FIG. 4 in the order of manufacturing steps. The same reference numerals in FIGS. 6A to 6C denote the same parts as in FIGS. 3 and 4, and a description thereof will be omitted.

As shown in FIG. 6A, field insulating films 2 are formed on the upper surface of a substrate 1 by, e.g., selective oxidation. A first gate insulating film 5 is then formed, on the upper surfaces of element regions isolated by the field insulating films 2, by, e.g., thermal oxidation. A first polysilicon layer 6 is deposited on the entire upper surface of the resultant structure by, e.g., the CVD method. A second gate insulating film 7 is formed on the upper surface of the first polysilicon layer 6 by, e.g., thermal oxidation. A second polysilicon layer 8 is deposited on the entire upper surface of the resultant structure by, e.g., the CVD method.

Subsequently, as shown in FIG. 6B, a photoresist 17 is applied to the entire upper surface of the resultant structure and is formed into a pattern of control gate electrodes and of floating gate electrodes by photoetching. The second polysilicon layer 8, the second gate insulating film 7, and the first polysilicon layer 6 are sequentially etched by the RIE method (anisotropic etching) using the patterned photoresist 17 as a mask. A portion of the first gate insulating film 5 which is located on a source/drain diffusion layer formation region (not shown) is etched to expose a surface portion of the substrate 1. Note that this series of etching operations are performed by using only one photoresist 17 as a mask.

As shown in FIG. 6C, gate oxidation is performed again with respect to a portion of the source/drain diffusion layer formation region (not shown) which corresponds to the exposed surface portion of the substrate 1 by, e.g., thermal oxidation. At this time, thermal oxidation films 18 (omitted in FIG. 4) are respectively formed on the upper surfaces of the control gate electrodes and the floating gate electrodes 6 which consist of polysilicon. Thereafter, an insulating interlayer 13 is deposited on the entire upper surface of the resultant structure by, e.g., the CVD method. After annealing is performed to flatten the entire surface of the insulating interlayer 13, a photoresist (not shown) is applied to the entire upper surface of the resultant structure. The photoresist is formed into a pattern for forming contact holes by photoetching. Contact holes 14 are formed by the CDE method (isotropic etching) and the RIE method (anisotropic etching) using the patterned photoresist (not shown) as a mask. After the photoresist (not shown) is removed, a first aluminum layer is formed by, e.g., sputtering. Subsequently, this aluminum film is patterned into the wires 15 connecting the memory cells adjacent to each other in the channel width direction and serving as a word line and into the bit lines 16.

Note that a plurality of memory cells are integrally formed to constitute a matrix. In addition, the wires 15 are formed in the row direction, while the bit lines 16 are formed in the column direction.

The device according to the first embodiment is manufactured by the above-described steps.

In the EPROM and the method of manufacturing the same according to the first embodiment, as is apparent from the description of the memory device which is made with reference to FIG. 5, the breakdown voltage of the second gate insulating film 7 is increased.

Such an increase in breakdown voltage is based on the following facts. The second gate insulating film 7 is formed on the first polysilicon layer 6 while its upper surface is made very flat because no cell slits are formed in the first polysilicon layer 6 unlike in the conventional device.

In addition, there is no portion at which the corner portion of the floating gate electrode 6 opposes the control gate electrode 8, which causes electric field concentration, between the floating gate electrode 6 and the control gate electrode 8.

Furthermore, in the manufacturing method according to the first embodiment, no cell slits are formed in the first polysilicon layer 6, and the multi-layered structure of the control gate electrode 8 and the floating gate electrode 6 are formed and subsequently patterned. For this reason, a local reduction in thickness of each field insulating film 2 as described above does not occur.

With the above-described arrangement, the device of the first embodiment has the second gate insulating film having a high breakdown voltage. In addition, in the manufacturing method, no reduction in thickness of each field insulating film occurs, thereby providing a highly reliably device which has a high resistance to defects in the row direction and which can prevent application of a voltage to the control gate electrode due to a short circuit between the control gate electrode and the substrate.

Another advantageous effect of the device of the first embodiment is that the operating speed is increased.

This is because the control gate electrodes (second polysilicon layer) 8 divided in units of memory cells are connected to each other in the channel width direction by using a material having a small resistance, e.g., aluminum, and are used as a word line.

When the structure of the device of the present invention is viewed, it is found that there is no pattern that the second polysilicon layer 6 crosses the field insulating film 2 in direct contact therewith.

With this arrangement, the following effects can be obtained.

In the conventional structure, since the second polysilicon layer 8 crosses the field insulating film 2 in contract therewith, ion implantation for the prevention of field inversion must be performed at a high concentration in order to prevent inversion of the conductivity type of a portion of the substrate 1 immediately under the field insulating film 2.

According to the structure of the present invention, however, in comparison with the conventional structure, the field inversion preventing effect, i.e., the inversion resistance, can be improved with ion implantation for the prevention of field inversion at substantially the same dose as that in the conventional structure. For example, the inversion resistance can be increased twice or more depending on the thickness of the insulating interlayer 13.

Furthermore, if the device of the first embodiment is only required to have inversion resistance similar to that of the conventional structure, the dose at which ion implantation for the prevention of field inversion is performed can be decreased. With a decrease in dose, for example, the occurrence of defects in the substrate 1 can be suppressed.

Moreover, in the manufacturing method according to the first embodiment, since photoetching for patterning floating gate electrodes and photoetching for patterning control electrodes are performed in the same step, one patterning photoetching step can be omitted, unlike the conventional technique. Therefore, a reduction in manufacturing cost can be achieved.

With a decrease in number of steps, the yield can also be increased.

The second embodiment of the present invention will be described below with reference to FIGS. 7 and 8.

Figure 7:
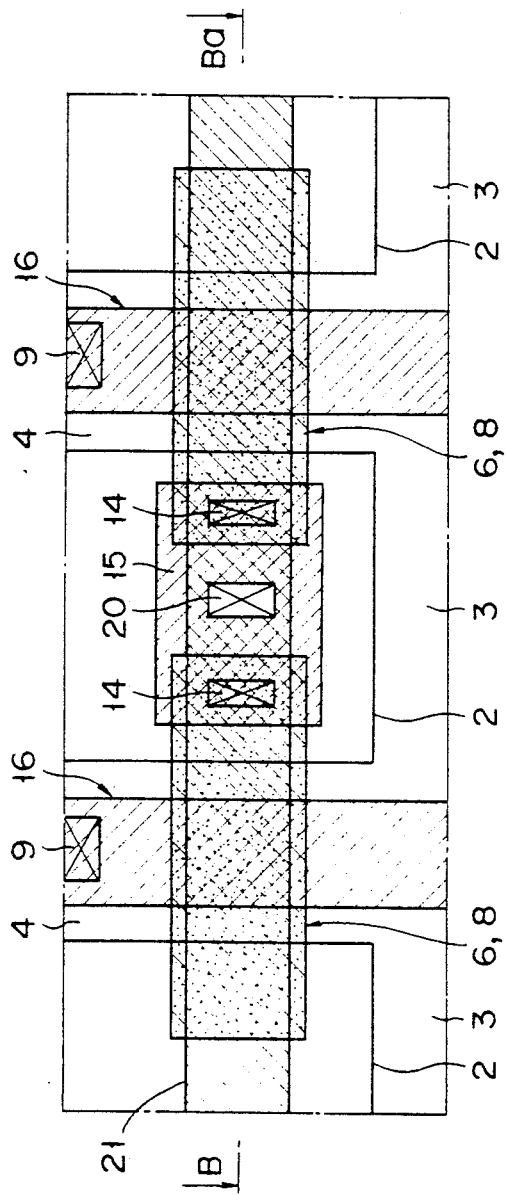
FIG. 7 is a plan view showing a pattern of an EPROM according to the second embodiment of the present invention.

FIG. 7 is a plan view showing a pattern of a two-bit memory cell portion of an EPROM according to the second embodiment of the present invention. FIG. 8 is a sectional view taken along a line B—Ba in FIG. 7. The same reference numerals in FIGS. 7 and 8 denote the same parts as in FIGS. 3 and 4, and a description thereof will be omitted.

Figure 8:
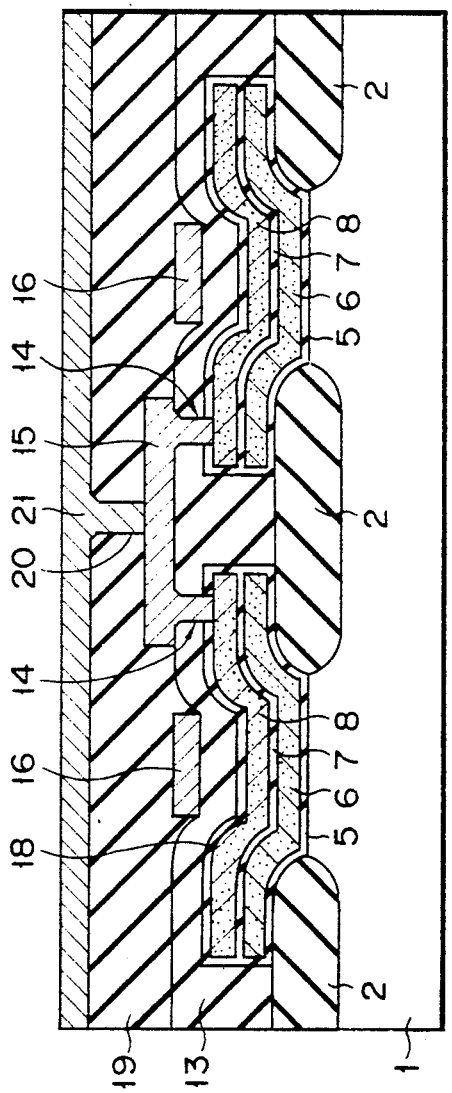
FIG. 8 is a sectional view taken along a line B—Ba in FIG. 7.

As shown in FIGS. 7 and 8, the device of the second embodiment is characterized in that a second wire 21 serving as a main word line is connected to a first wire 15.

Referring to FIGS. 7 and 8, a second insulating interlayer 19 is deposited on an insulating interlayer 13. A second contact hole 20 communicating with the wire 15 is formed in the second insulating interlayer 19. The second wire 21 extending in the channel width direction is formed through the second contact hole 20.

In an actual device, the two-bit pattern of the second wire 21 shown in FIGS. 7 and 8 repeatedly appears by the number of times corresponding to a predetermined number of bits in the channel width direction. For example, an eight-bit memory device can be formed by repeatedly forming the pattern shown in FIGS. 7 and 8 four times in the channel width direction.

The second wire 21 serves as a main word line and distributes/applies the word line potential to the respective word lines 15 connected the second wire 21. Each word line applies the word line potential to at least two control gate electrodes 8.

In the above-described device according to the second embodiment, at least two first wires 15 (only one wire 15 is shown in FIGS. 7 and 8) are shunt-connected to each other.

The number of contacts with respect to the control gate electrodes 8 is simply reduced to ½ that of the device of the first embodiment. In addition, the resistance component is reduced due to the shunt operation, and a further increase in operating speed can be expected.

A method of manufacturing the device of the second embodiment will be described below with reference to FIGS. 9A and 9B. The same reference numerals in FIGS. 9A and 9B denote the same parts as in FIGS. 7 and 8, and a description thereof will be omitted.

Figure 9A:
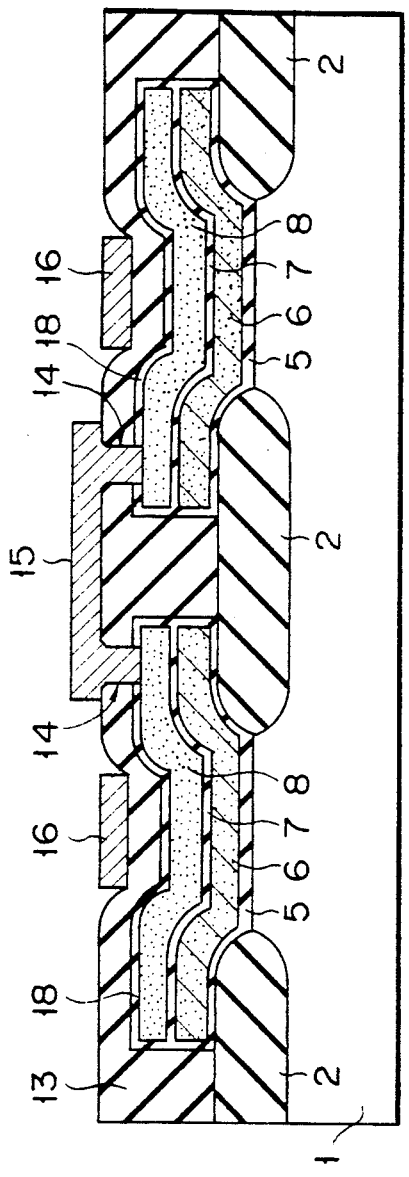
FIGS. 9A and 9B are sectional views showing the memory device according to the second embodiment in the order of manufacturing steps.

FIG. 9A shows one step of the manufacturing process of the device of the second embodiment and is equivalent to FIG. 6C.

The step in FIG. 9A is different from the step in FIG. 6C and the preceding steps in the following point. In the step shown in FIG. 6C, the first wires constitute a pattern for connecting the respective control gate electrodes 8. In contrast to this, in the step shown in FIG. 9A, each first wire 15 constitutes a pattern for connecting the control gate electrodes 8 of at least two bits to each other. Therefore, a mask pattern for patterning the first wires 15 of the device shown in FIG. 9A is different from that shown in FIG. 6C.

Figure 9B:
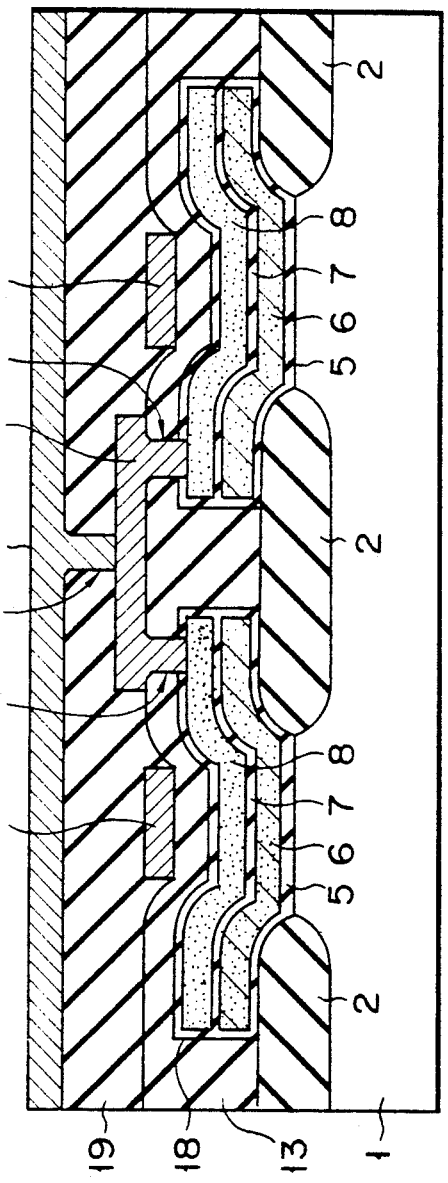

As shown in FIG. 9B, after the first wires 15 and bit lines 16 are patterned, a second insulating interlayer 19 is deposited on the resultant structure. The second insulating interlayer 19 is then flattened by annealing. A photoresist (not shown) is applied to the entire upper surface of the resultant structure. A contact hole pattern is then formed in the photoresist by photoetching. A second contact hole 20 is formed by the CDE method (isotropic etching) and the RIE method (anisotropic etching) using the patterned photoresist as a mask. After the photoresist (not shown) is removed, a second aluminum film is formed by, e.g., sputtering. Subsequently, this aluminum film is patterned into the second wire 21 for connecting the first wires 15, which are adjacent to each other in the channel width direction, to each other by a photoetching method using, e.g., a photoresist (not shown).

With the above-described steps, the device of the second embodiment is manufactured.

In the EPROM according to the second embodiment, a further increase in operating speed can be expected in addition to the effects described with reference to the first embodiment.

In the first and second embodiments, the floating gate electrodes 6 and the control gate electrodes 8 are constituted by polysilicon. However, they may be constituted by another conductive material, e.g., a polycide film or a silicide film.

In addition, the first and second wires 15 and 21, which are made of aluminum, may be made of another conductive material, e.g., an alloy of aluminum and another metal, or a metal film such as a tungsten film.

The materials for the floating gate electrodes, for control gate electrodes, and for the wires are replaced with other materials in this manner without impairing the effects of the present invention and without departing from the gist of the present invention.

The third embodiment of the present invention will be described below with reference to FIGS. 10 to 12.

Figure 10:
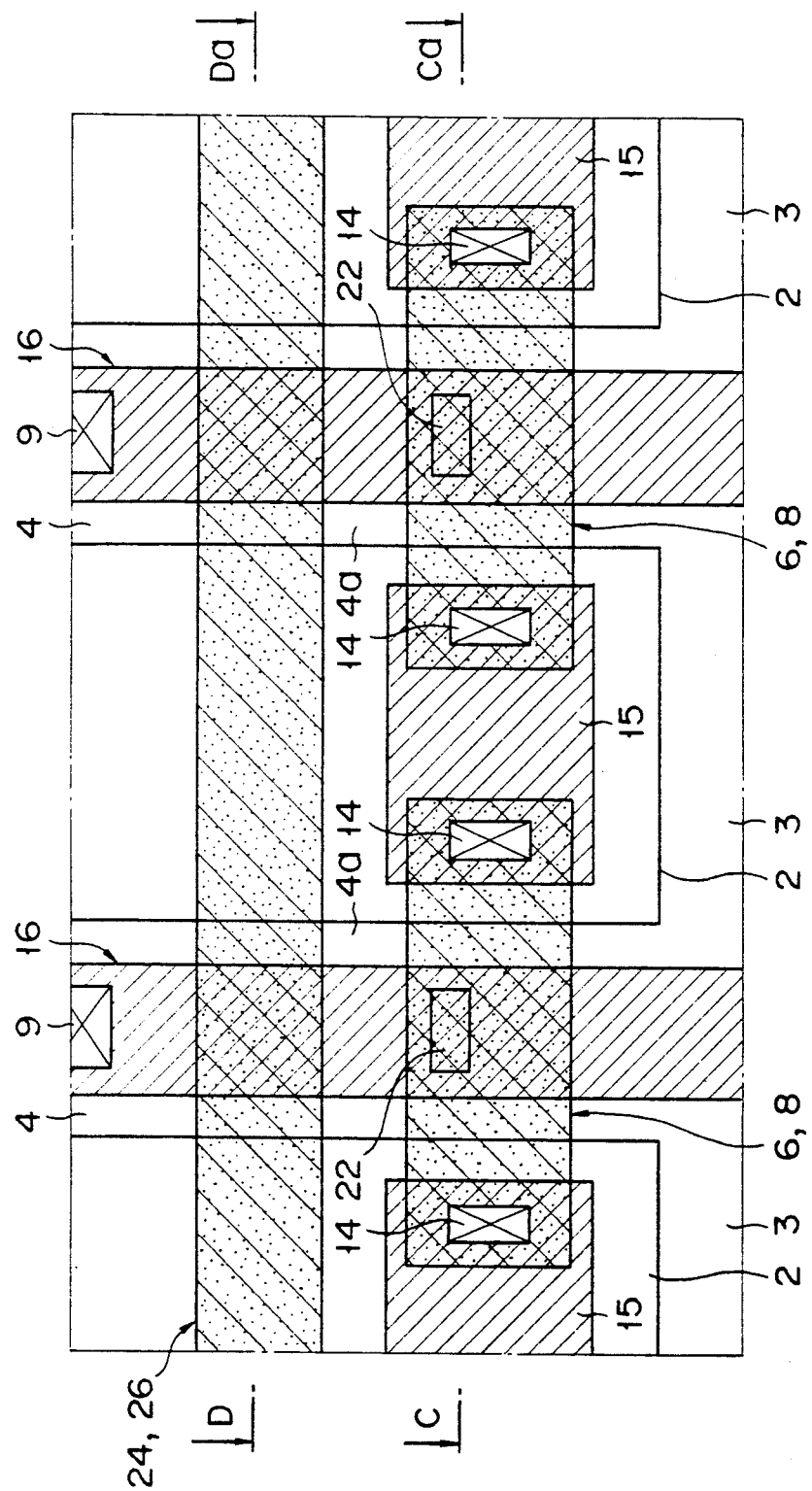
FIG. 10 is a plan view showing a pattern of an E$^2$-PROM according to the third embodiment of the present invention.

FIG. 10 is a plan view showing a pattern of a two-bit memory cell portion of an E$^2$PROM according to the third embodiment of the present invention. FIG. 11 is a sectional view taken along a line C—Ca in FIG. 10. FIG. 12 is a sectional view taken along a line D—Da in FIG. 10. The same reference numerals in FIGS. 10 to 12 denote the same parts as in FIGS. 2 and 3, and a description thereof will be omitted.

Figure 11:
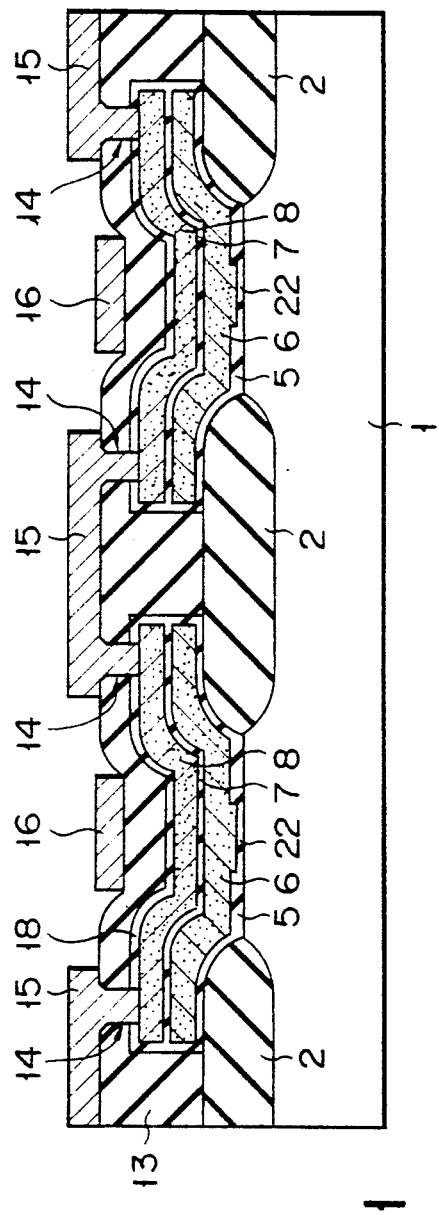
FIG. 11 is a sectional view taken along a line C—Ca in FIG. 10.
Figure 12:
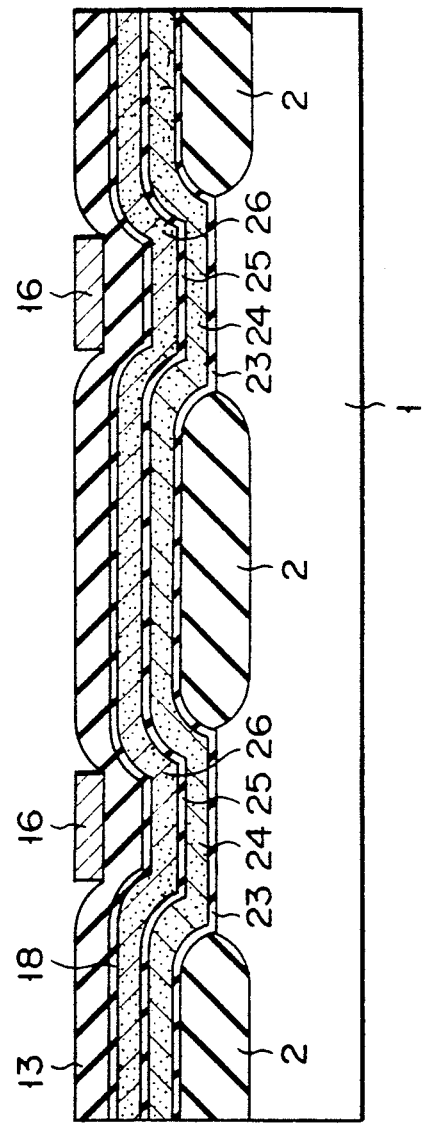
FIG. 12 is a sectional view taken along a line D—Da in FIG. 10.

As shown in FIGS. 10 to 12, the device of the third embodiment is characterized in that the device structure described with reference to the first embodiment is applied to an E$^2$PROM.

Referring to FIGS. 10 to 12, in the E$^2$PROM, a tunnel insulating film 22 having a thickness smaller than that of a first gate insulating film 5 is arranged at a portion under a floating gate electrode 6 because of a function of the E$^2$PROM.

In addition, the E$^2$PROM has a selection transistor in addition to a memory transistor consisting of a floating gate electrode 6 and a control gate electrode 8.

The selection transistor is present on a drain region 4 side of the memory transistor (consisting of the floating gate electrode 6 and the control gate electrode 8).

In the third embodiment, as shown in FIG. 10, the selection transistor has a so-called stacked selection gate structure constituted by a first selection gate electrode formed on a first gate insulating film 5, and a second selection gate electrode 26 formed on the first selection gate electrode 24 through a second gate insulating film 7.

Referring to FIG. 10, reference numeral 4a denotes a diffusion layer having a conductivity type opposite to that of a substrate 1 and connecting the memory transistor to the selection transistor.

Note that a region under the tunnel insulating film 22 is also a diffusion layer (not shown) having a conductivity type opposite to that of the substrate 1.

In such an arrangement, the same effects as those described with reference to the first embodiment can be obtained especially at a portion corresponding to the memory transistor.

In a method of manufacturing the device of the third embodiment, after the first gate insulating film 5 is formed by the same method as that used for the device of the fist embodiment, only a portion, of the first gate insulating film 5, corresponding to a tunnel insulating film formation region, is selectively removed. A tunnel insulating film 22 is then formed on the portion, from which the first gate insulating film 5 is removed, by, e.g., thermal oxidation.

Subsequently, the device of the third embodiment can be manufactured by substantially the same steps as in the method of manufacturing the device of the first embodiment which is described with reference to FIGS. 6A to 6C.

It is necessary, however, that in a photoetching step performed upon deposition of a second polysilicon layer, the pattern of the second selection gate electrodes 26 must be added to the pattern of the control gate electrodes 8.

The fourth embodiment of the present invention will be described below with reference to FIGS. 13 to 16.

Figure 13:
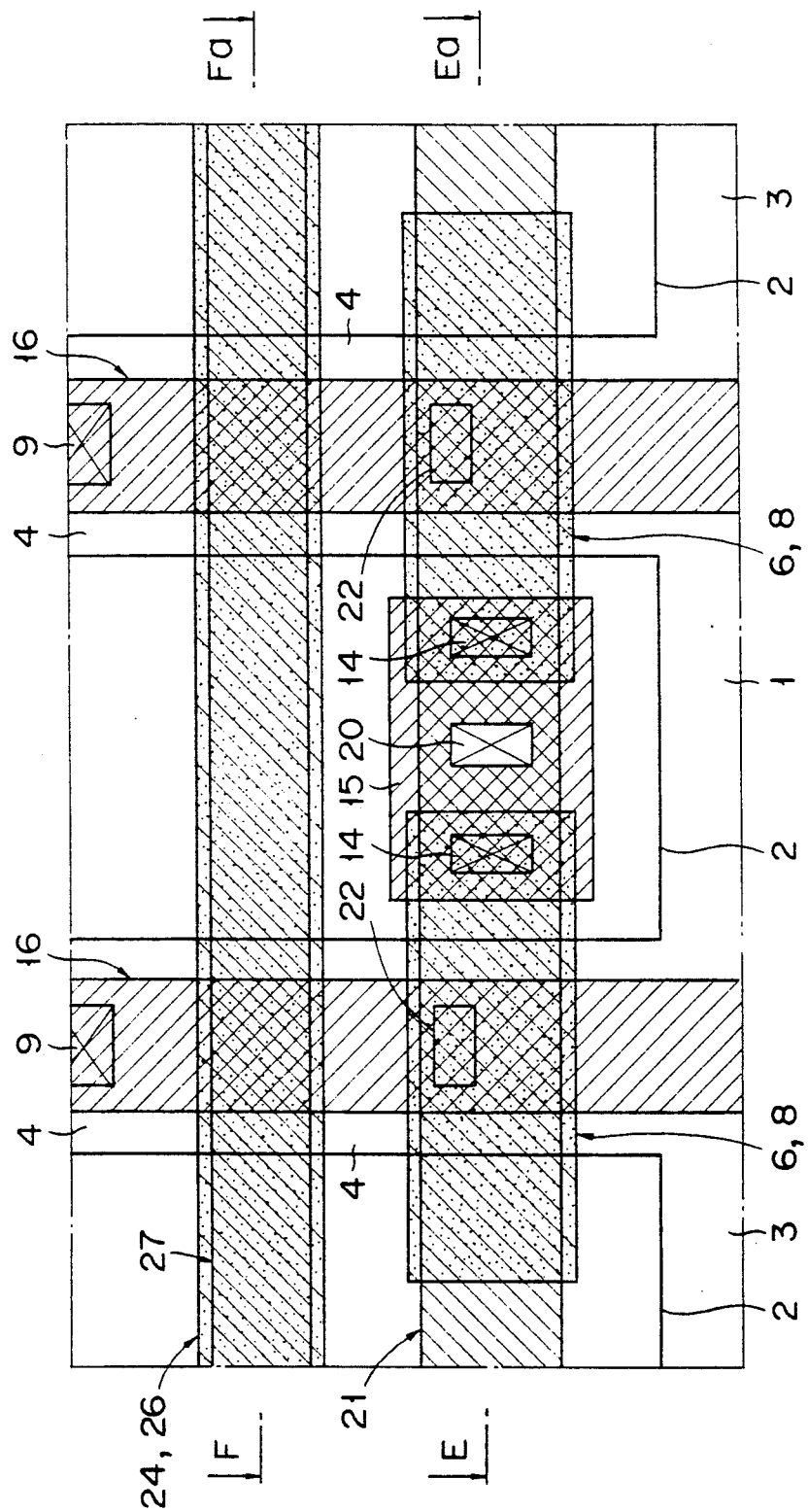
FIG. 13 is a plan view showing a pattern of an E$^2$-PROM according to the fourth embodiment of the present invention.
Figure 14:
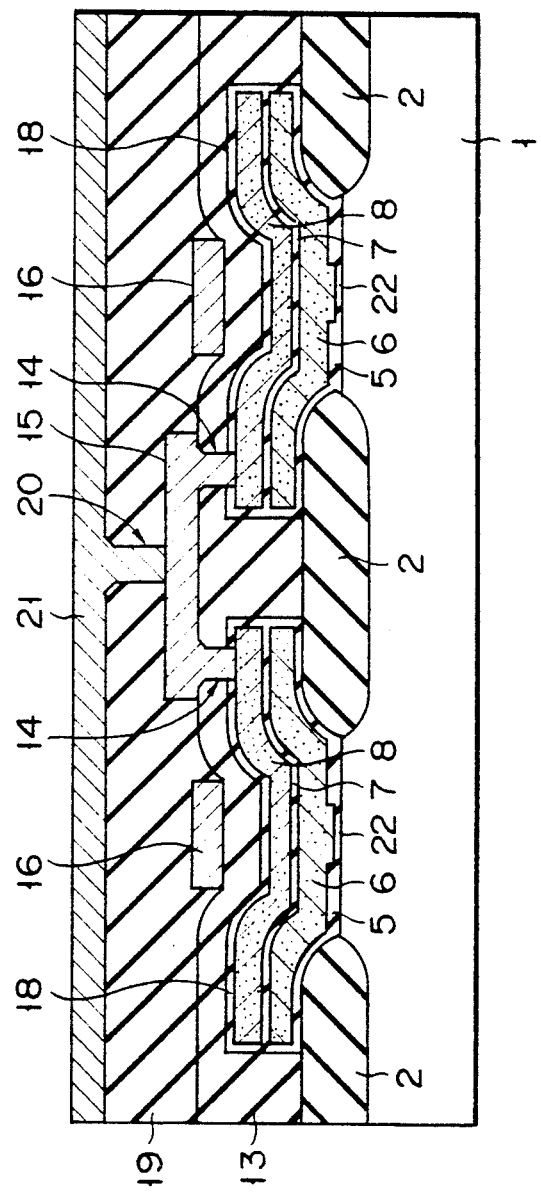
FIG. 14 is a sectional view taken along a line E—Ea in FIG. 13.
Figure 15:
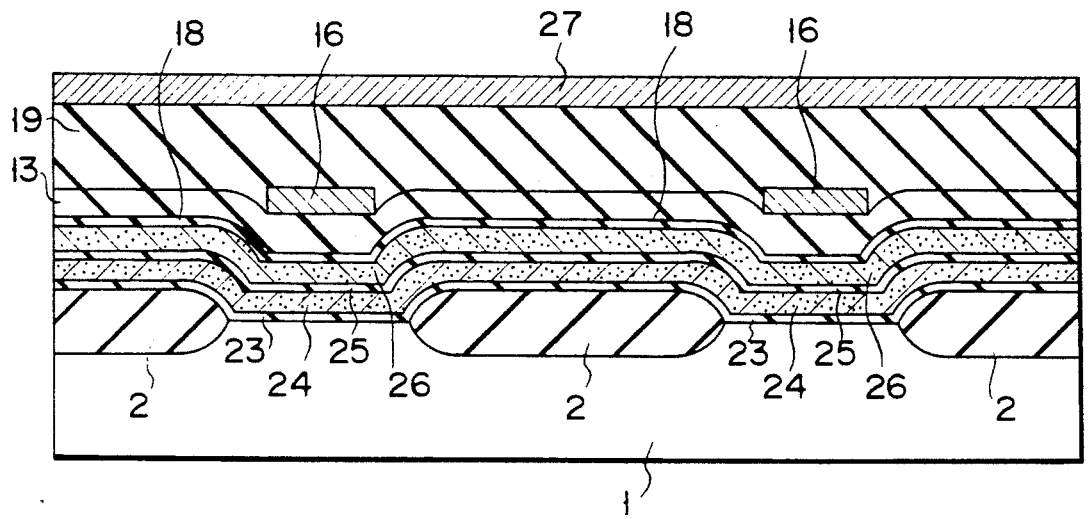
FIG. 15 is a sectional view taken along a line F—Fa in FIG. 13.
Figure 16:
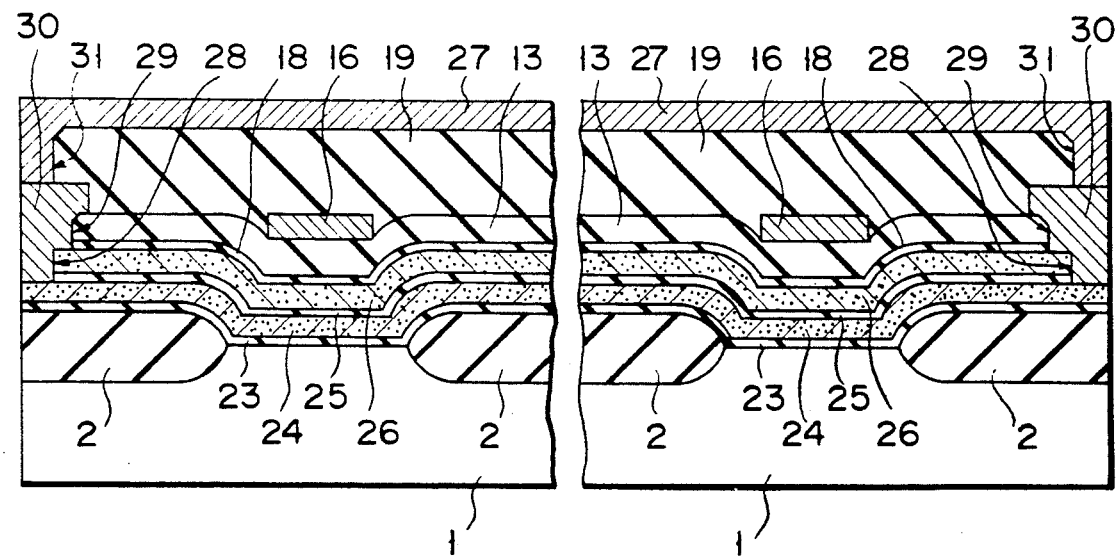
FIG. 16 is a sectional view showing a selection gate end portion in FIG. 15.

FIG. 13 is a plan view showing a two-bit memory cell portion of an E$^2$PROM according to the fourth embodiment of the present invention. FIG. 14 is a sectional view taken along a line E—Ea in FIG. 13. FIG. 15 is a sectional view taken along a line F—Fa in FIG. 13. FIG. 16 is a sectional view showing a selection gate end portion of the cross-section shown in FIG. 15. The same reference numerals in FIGS. 10 to 12 denote the same parts as in FIGS. 7, 8, and 10, and a description thereof will be omitted.

As shown in FIGS. 13 to 16, the device of the fourth embodiment is characterized in that the device structure described with reference to the second embodiment is applied to an E²PROM.

Referring to FIGS. 13 to 16, a third wire 27 constituted by a second aluminum film is formed on first and second selection gate electrodes 24 and 26 of a selection transistor (near the line F—Fa in FIG. 13). This third wire 27 is connected to the first and second selection gate electrodes 24 and 26 at an end portion of a selection gate line, as shown in FIG. 16.

Note that the first and second selection gate electrodes 24 and 26 and the third wire 27 may be connected to each other at a portion other than the abovementioned end portion. For example, such connection may be performed in units of bytes.

This connecting structure will be described in detail below. As shown in FIG. 16, a second polysilicon layer (second selection gate electrode) 26 is selectively etched to form a portion 28. A contact hole 29 is formed in an insulating interlayer 13 so as to communicate with a first polysilicon layer (first selection gate electrode) 24 through the portion 28 formed by selectively etching the second polysilicon layer 26. In this contact hole 29, a contact electrode 30 consisting of a first aluminum film is formed to connect the first and second polysilicon layers 24 and 26 to each other.

In addition, a contact hole 31 is formed in a second insulating interlayer 19 so as to communicate with the contact electrode 30. The third wire 27 is connected to the contact electrode 30 through the contact hole 31.

As a result, the third wire 27 serves as a bypass line of the selection gate line.

The following effect can be obtained in the device according to the fourth embodiment in addition to the effects described with reference to the second embodiment. Since the third wire 27 consisting of aluminum having a relatively small resistance value is shunt-connected to the selection gate electrodes 24 and 26, an increase in operating speed can also be expected by means of the selection gate line.

In a method of manufacturing the device of the fourth embodiment, after a tunnel insulating film 22 is formed in the same method as in the third embodiment, first polysilicon layers 6 and 24, second gate insulating films 7 and 25, and second polysilicon layers 8 and 26 are formed in the same manner as in the first embodiment.

Subsequently, similar to the third embodiment, a photoetching step is performed by using a pattern (second polysilicon layer 26 pattern) including a selection gate pattern.

Only portions of the second polysilicon layers 8 and 26 which correspond to end portions of the selection gate line are selectively removed (corresponding to the portions 28 in FIG. 16).

After contact holes are formed in the first and second polysilicon layers 24 and 26 and in the first insulating interlayer 13, a first aluminum film is formed as in the second embodiment. The first aluminum film is patterned to form the wires 15, the bit lines 16, and the contact electrodes 30. The second insulating interlayer 19 is deposited and flattened. Contact holes are then formed in the second insulating interlayer 19, and a second aluminum film is formed. The second aluminum film is formed into patterns of second and third wires.

The device according to the fourth embodiment is manufactured by the above-described method.

The fifth embodiment of the present invention will be described below with reference to FIGS. 17 and 18.

Figure 17:
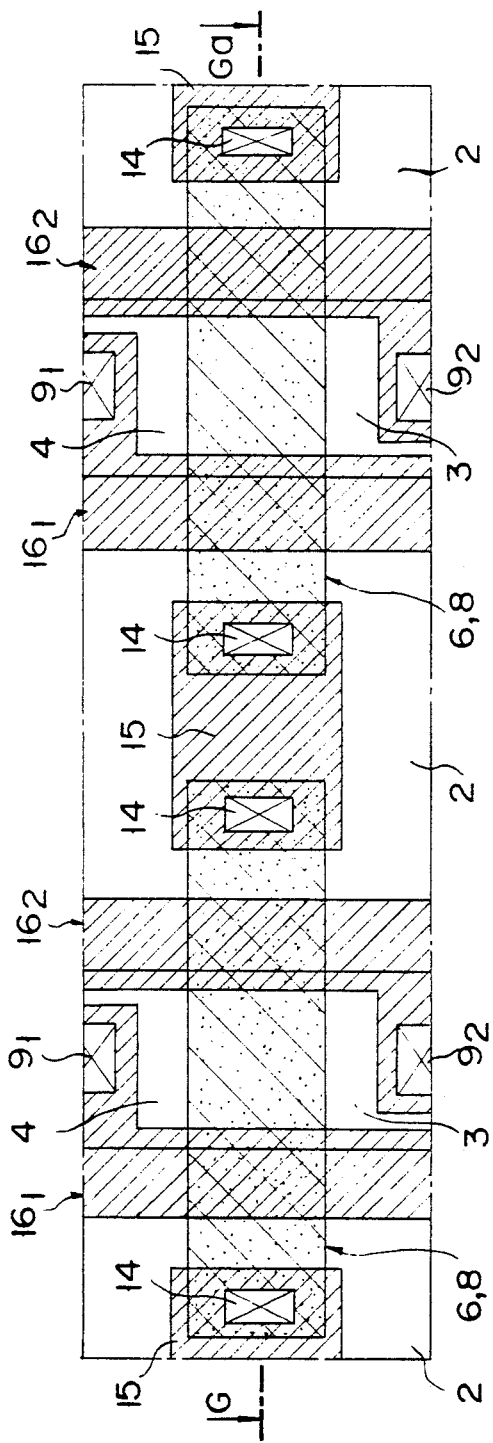
FIG. 17 is a plan view showing a pattern of an EPROM according to the fifth embodiment of the present invention.

FIG. 17 is a plan view showing a pattern of a two-bit memory cell portion of an EPROM according to the fifth embodiment of the present invention. FIG. 18 is a sectional view taken along a line G—Ga in FIG. 17. The same reference numerals in FIGS. 17 and 18 denote the same parts as in FIGS. 3 and 4, and a description thereof will be omitted.

Figure 18:
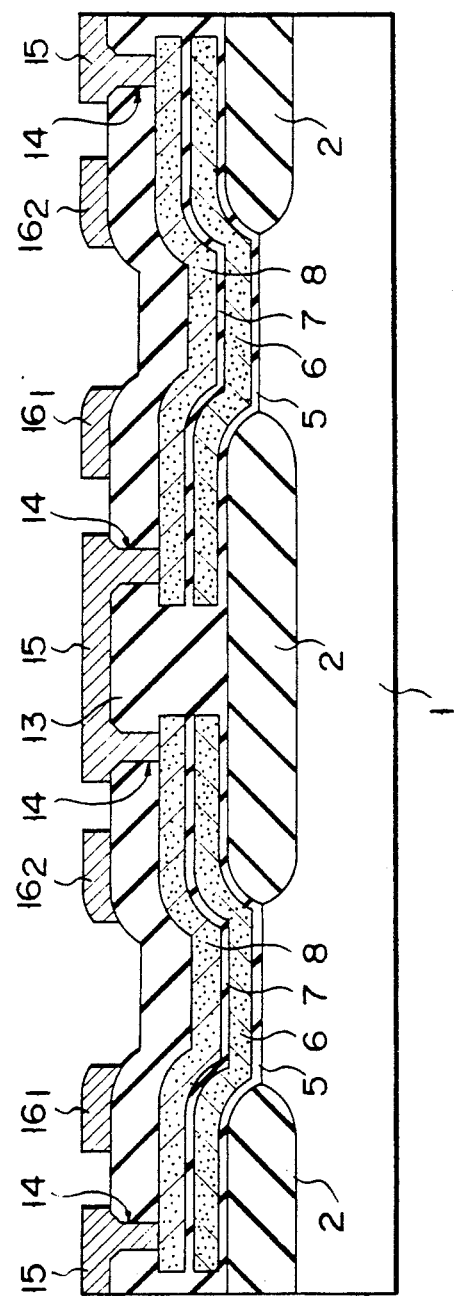
FIG. 18 is a sectional view taken along a line G—Ga in FIG. 17.

As shown in FIGS. 17 and 18, the device of the fifth embodiment is characterized in that the EPROM of the first embodiment is modified to form an EPROM of a two-bus scheme.

Referring to FIGS. 17 and 18, a drain wire (bit line) $16_1$ is connected to a drain region 4 through a contact hole $9_1$.

Similarly, a source wire $16_2$ is connected to a source region 3 through a contact hole $9_2$.

An EPROM of a two-bus scheme may be applied to the present invention in this manner.

In addition, the drain and source wires $16_1$ and $16_2$ can be made of the same aluminum film as that constituting a wire 15.

The sixth embodiment of the present invention will be described below with reference to FIGS. 19 and 20.

FIG. 19 is a plan view showing a pattern of a two-bit memory cell portion of an EPROM according to the sixth embodiment of the present invention. FIG. 20 is a sectional view taken along a line H—Ha in FIG. 19. The same reference numerals in FIGS. 19 and 20 denote the same parts as in FIGS. 7, 8, 17, and 18, a description thereof will be omitted.

As shown in FIGS. 19 and 20, the device of the sixth embodiment is characterized in that the EPROM of the second embodiment is modified to form an EPROM of a two-bus scheme.

The seventh embodiment of the present invention will be described below with reference to FIGS. 21 to 23.

Figure 21:
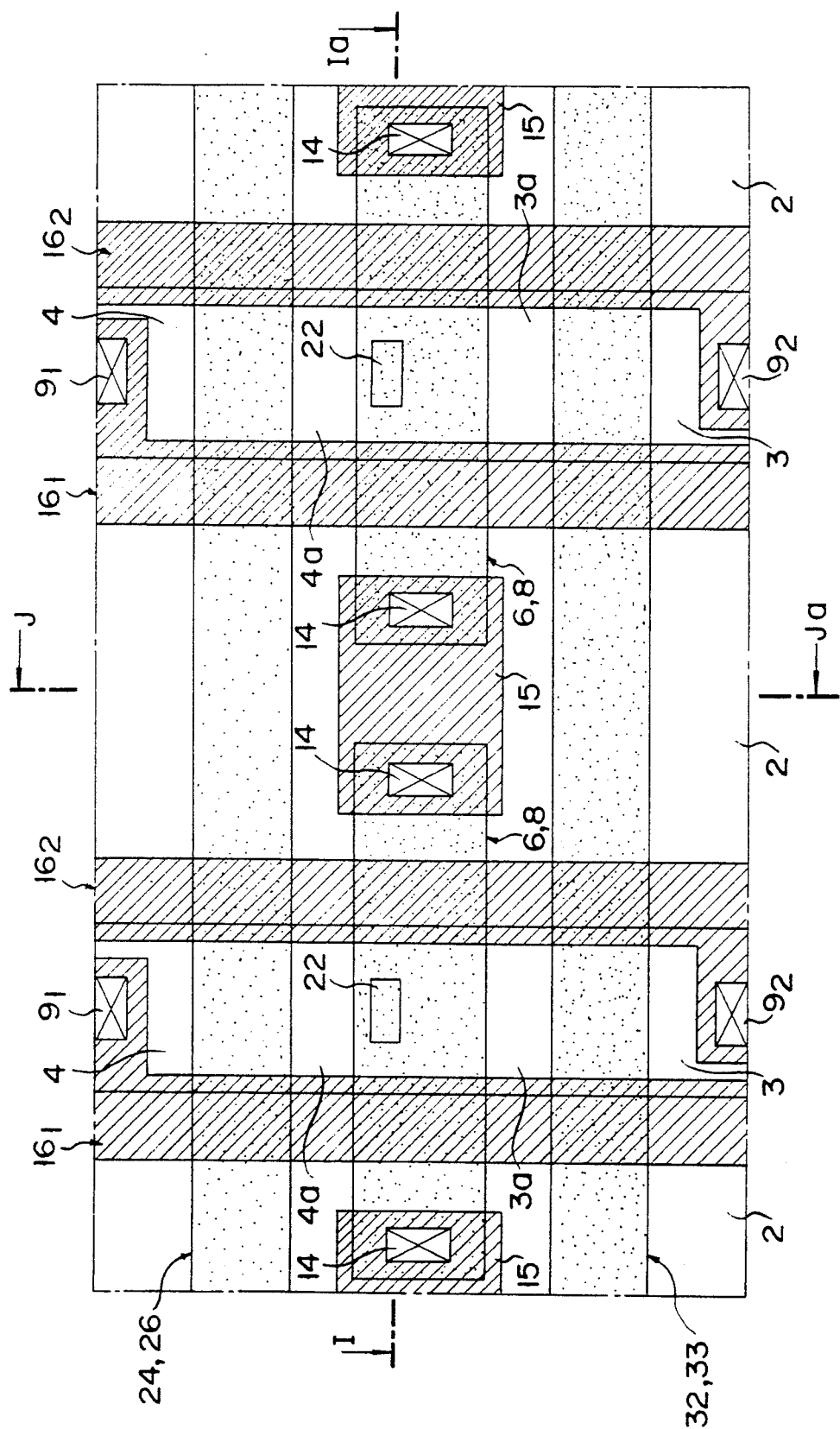
FIG. 21 is a plan view showing a pattern of an $E^2$-PROM according to the seventh embodiment of the present invention.

FIG. 21 is a plan view showing a pattern of a two-bit memory cell portion of an E²PROM according to the seventh embodiment of the present invention. FIG. 22 is a sectional view taken along a line I—Ia in FIG. 21. FIG. 23 is a sectional view taken along a line J—Ja in FIG. 21. The same reference numerals in FIGS. 21 to 23 denote the same parts as in FIGS. 10 to 12, 17, and 18, and a description thereof will be omitted.

Figure 22:
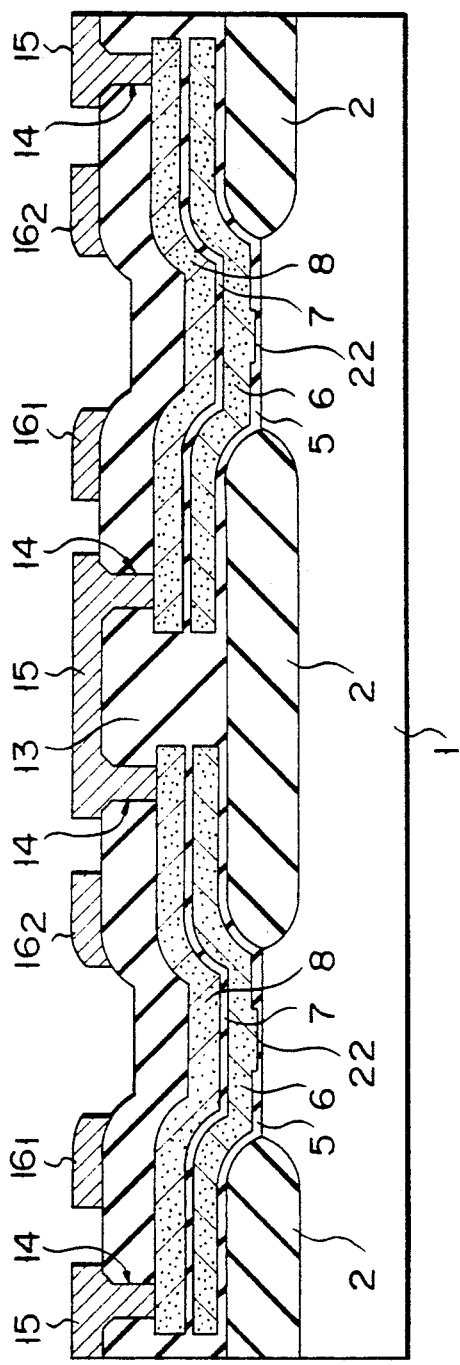
FIG. 22 is a sectional view taken along a line I—Ia in FIG. 21.
Figure 23:
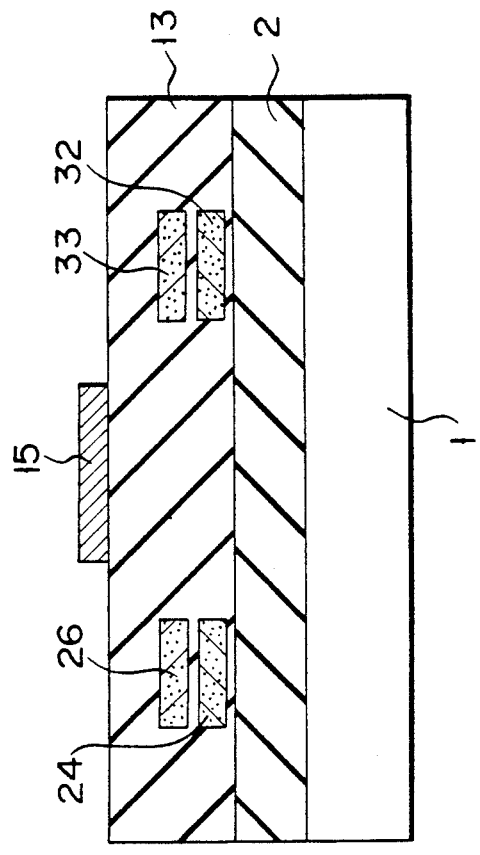
FIG. 23 is a sectional view taken along a line J—Ja in FIG. 21.

As shown in FIGS. 21 to 23, the device of the seventh embodiment is characterized in that the E²PROM of the third embodiment is modified to form an E²PROM of a two-bus scheme.

The seventh embodiment further includes a read transistor.

Referring to FIGS. 21 to 23, a read transistor is arranged on the source region 3 side of a memory transistor (consisting of a floating gate electrode 6 and a control gate electrode 8).

In this embodiment, this read transistor also has a stacked gate structure.

As especially shown in FIG. 23, this stacked gate structure is constituted by a first read gate electrode 32 consisting of a first polysilicon layer, and a second read gate electrode 33 consisting of a second polysilicon layer and formed on the first read gate electrode 32 through an insulating film.

Referring to FIG. 21, reference numeral 3a denotes a diffusion layer, having a conductivity type opposite to that of a substrate 1, for connecting a memory transistor and a read transistor to each other.

Note that a region under the tunnel insulating film 22 is also constituted by a diffusion layer (not shown) having a conductivity type opposite to that of the substrate 1.

The eighth embodiment of the present invention will be described below with reference to FIGS. 24 to 26.

Figure 24:
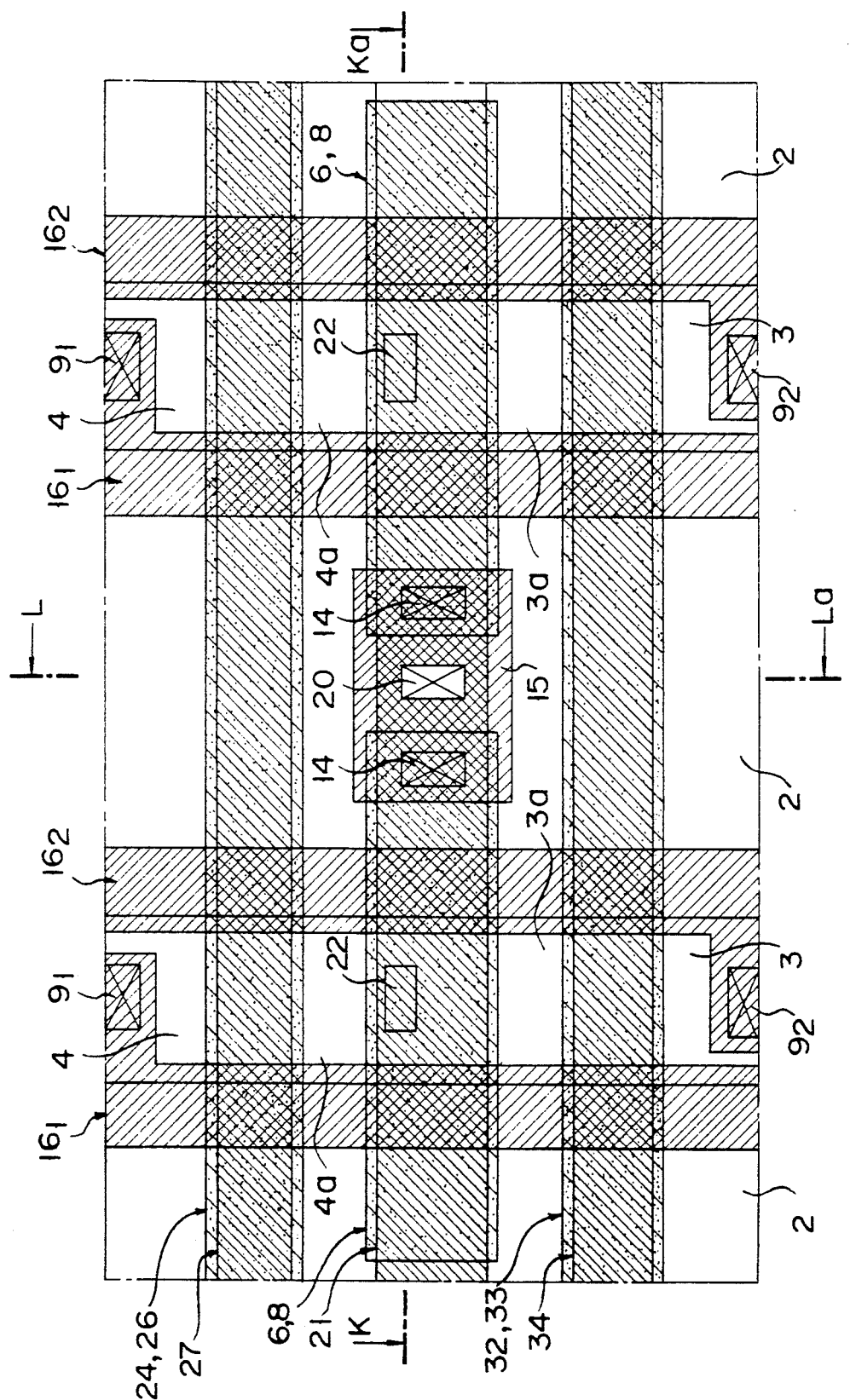
FIG. 24 is a plan view showing a pattern of an $E^2$-PROM according to the eighth embodiment of the present invention.

FIG. 24 is a plan view showing a pattern of a two-bit memory cell portion of an $E^2PROM$ according to the eighth embodiment of the present invention. FIG. 25 is a sectional view taken along a line K—Ka in FIG. 24. FIG. 26 is a sectional view taken along a line L—La in FIG. 24. The same reference numerals in FIGS. 24 to 26 denote the same parts as in FIGS. 13 to 15, 19, and 20, and a description thereof will be omitted.

Figure 25:
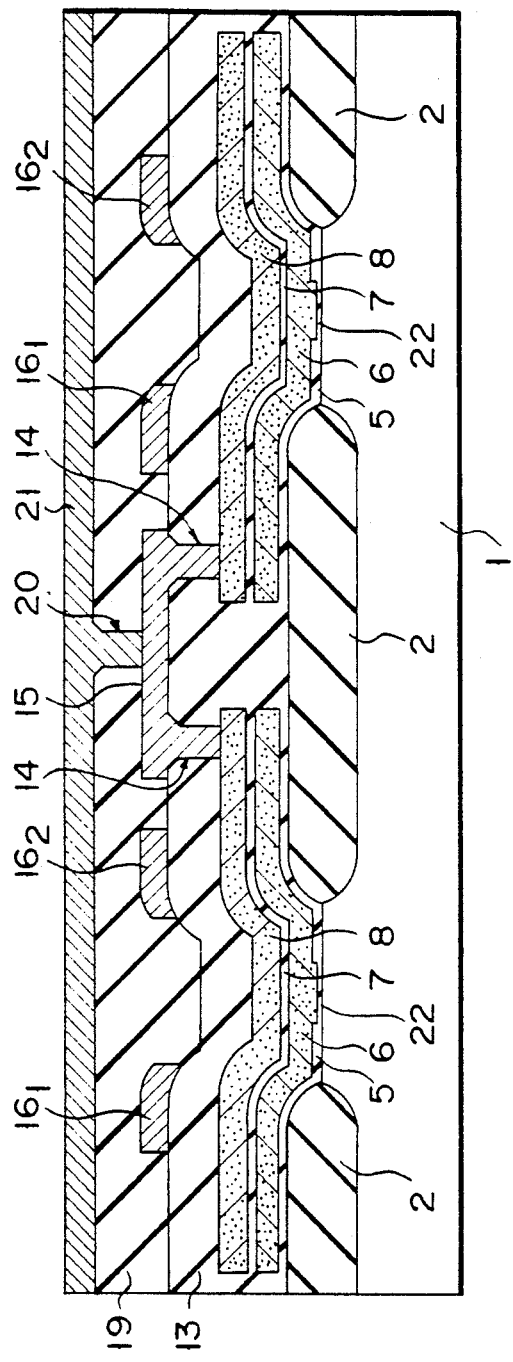
FIG. 25 is a sectional view taken along a line K—Ka in FIG. 24.
Figure 26:
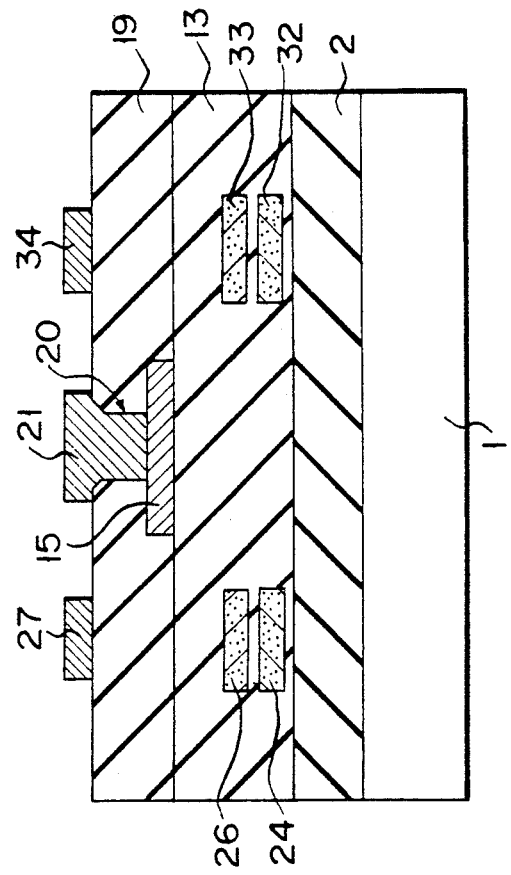
FIG. 26 is a sectional view taken along a line L—La in FIG. 24.

As shown in FIGS. 24 to 26, the device of the eighth embodiment is characterized in that the $E^2PROM$ of the fourth embodiment is modified to form an $E^2PROM$ of a two-bus scheme.

This embodiment further includes a read transistor.

Referring to FIGS. 24 to 26, a fourth wire 34 consisting of a second aluminum film is formed on a read transistor (denoted by reference numerals 32 and 33 in FIG. 26). This fourth wire 34 is connected to first and second read gate electrodes 32 and 33 at an end portion of a read gate line.

Note that the first and second read gate electrodes 32 and 33 may be connected to the fourth wire 34 at a portion other than the end portion. For example, the above connection may be performed in units of bytes.

This connection may be performed by the same method as that used to connect the third wire 27 to the first and second selection gate electrodes 24 and 26, which is described with reference to the fourth embodiment.

As described above, in the eighth embodiment, the following effect can be expected in addition to the effects of the fourth embodiment and of the two-bus scheme. Since the fourth wire 34 consisting of aluminum having a relatively small resistance value is shunt-connected to the read gate electrodes 32 and 33, an increase in operating speed by means of the read gate line can be expected.

Similar to the first and second embodiments, in the third to eighth embodiments, even if the materials for the respective types of gate electrodes and wires are replaced with other materials, the effects of the present invention are not impaired.

In the first to eighth embodiments, the respective types of contact holes, e.g., contact holes formed to communicate with the control gate electrodes and the like, can be variously changed in shape and position in accordance with requirements in design of elements.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A nonvolatile semiconductor memory device comprising:
   a semiconductor substrate;
   a field oxidation film selectively formed on said semiconductor substrate;
   a first gate insulating film formed on an exposed surface of said semiconductor substrate and on said field oxidation film, and
   a plurality of memory cells formed on said first gate insulating film; wherein each of said plurality of memory cells includes said first gate insulating film, a floating gate electrode, a second gate insulating film, and a control gate electrode, and said floating gate electrode and said control gate electrode of each of said plurality of memory cells are isolated from the floating gate electrodes and control gate electrodes of adjacent memory cells, respectively, so as to be formed into islands.

2. A device according to claim 1, wherein each floating gate electrode and each control gate electrode consists of polysilicon.

3. A device according to claim 1, wherein each floating gate electrode and each control gate electrode consists of polycide film.

4. A device according to claim 1, wherein each floating gate electrode and each control gate electrode consists of silicide film.

5. A nonvolatile semiconductor memory device comprising:
   a semiconductor substrate;
   a field oxidation film selectively formed on said semiconductor substrate;
   a first gate insulating film formed on an exposed surface of said semiconductor substrate and on said field oxidation film;
   a plurality of memory cells each comprising a floating gate electrode and a control gate electrode, said floating gate electrode and said control gate electrode of each of said memory cells being isolated from the floating gate electrodes and control gate electrodes of other adjacent memory cells, respectively, so as to be formed into islands;
   an insulating interlayer formed on said field oxidation film and on said control gate electrodes;
   contact hole passages extending through said insulating interlayer so as to expose portions of said control gate electrodes; and
   a plurality of wires, formed on said insulating interlayer, for connecting said control gate electrodes of memory cells of said plurality of memory cells, which are adjacent to each other in a word line direction, through said contact hole passages.

6. A device according to claim 5, wherein each floating gate electrode and each control gate electrode consists of polysilicon.

7. A device according to claim 5, wherein each floating gate electrode and each control gate electrode consists of polycide film.

8. A device according to claim 5, wherein said floating gate electrode and said control gate electrode consist of silicide films, respectively.

9. A device according to claim 5, wherein each wire consists of an aluminum film.

10. A device according to claim 5, wherein each wire consists of a tungsten film.

11. A nonvolatile semiconductor memory device comprising:
    a semiconductor substrate;
    a field oxidation film selectively formed on said semiconductor substrate;

a first gate insulating film formed on an exposed surface of said semiconductor substrate and on said field oxidation film;

a plurality of memory cells each comprising a floating gate electrode and a control gate electrode, said floating gate electrode and aid control gate electrode of each of said memory cells being isolated from the floating gate electrodes and control gate electrodes of other adjacent memory cells, respectively, so as to be formed into islands;

a first insulating interlayer formed on said field oxidation film and on said control gate electrodes;

first contact hole passages extending through said first insulating interlayer so as to expose portions of said control gate electrodes;

a plurality of first wires, formed on said first insulating interlayer, for connecting said control gate electrodes of memory cells of said plurality of memory cells, which are adjacent to each other in a word line direction, through said first contact hole passages;

a second insulating interlayer formed on said first insulating interlayer and on said plurality of first wires;

a second contact hole passage extending through said second insulating interlayer so as to expose a portion of said plurality of first wires; and a second wire, formed on said second insulating interlayer so as to be in contact with said plurality of first wires through said second contact hole passage, for shunt-connecting said plurality of first wires to each other.

12. A device according to claim 11, wherein each floating gate electrode and each control gate electrode consists of polysilicon.

13. A device according to claim 11, wherein each floating gate electrode and each control gate electrode consists of polycide film.

14. A device according to claim 11, wherein each floating gate electrode and each control gate electrode consists of silicide film.

15. A device according to claim 11, wherein said wires each consist of aluminum film.

16. A device according to claim 11, wherein said wire each consist of tungsten film.

17. A nonvolatile semiconductor memory device comprising:

a semiconductor substrate;

a plurality of field oxidation films selectively formed on said semiconductor substrate;

a plurality of memory cells each comprising a first gate insulating film, a floating gate electrode, a second gate insulating film, and a control gate electrode, formed by sequentially and selectively etching a first insulating film, a first conductive layer, a second insulating film, and a second conductive layer, which are sequentially formed on said semiconductor substrate and on said field oxidation films, so as to expose portions of said field oxidation films;

a thermal oxidation film formed by thermally oxidizing upper and side surfaces of said control gate electrodes and side surfaces of said floating gate electrodes;

an insulating interlayer formed on said field oxidation films and on said thermal oxidation film;

contact hole passages extending through said insulating interlayer so as to expose a portion of each of said control gate electrodes; and a wire, formed on said insulating interlayer, for connecting said control gate electrodes to each other.

18. A device according to claim 17, wherein each floating gate electrode and each control gate electrode consists of polysilicon.

19. A device according to claim 17, wherein each floating gate electrode and each control gate electrode consist of polycide film.

20. A device according to claim 17, wherein each floating gate electrode and each control gate electrode consist of silicide film.

21. A device according to claim 17, wherein said wire consists of aluminum film.

22. A device according to claim 17, wherein said wire consists of tungsten film.

23. A nonvolatile semiconductor memory device comprising:

a semiconductor substrate;

a plurality of field oxidation films selectively formed on said semiconductor substrate to perform element isolation;

a first gate insulating film formed on an exposed surface of said semiconductor substrate and on said plurality of field oxidation films;

a plurality of memory cells each comprising a first gate insulating film, a floating gate electrode, a second insulating film, and a control gate electrode, formed by sequentially etching a first insulating film, a first polysilicon layer, a second insulating film, and a second polysilicon layer, which are sequentially formed on said semiconductor substrate and on said field oxidation films, so as to expose portions of said field oxidation films;

a thermal oxidation film formed by thermally oxidizing upper and side surfaces of said control gate electrodes and side surfaces of said floating gate electrodes;

a first insulating interlayer formed on said field oxidation films and on said thermal oxidation films;

a plurality f first contact hole passages extending through said first insulating interlayer so as to expose portions of said control gate electrodes;

a plurality of first wires, formed on said first insulating interlayer, for connecting said control gate electrodes to each other;

a second insulating interlayer formed on said first insulating interlayer and on said plurality of first wires;

a second contact hole passage extending through said second insulating interlayer so as to expose a portion of each of said plurality of first wires; and a second wire, formed on said second insulating interlayer so as to be in contact with said plurality of first wires through said second contact hole passage, for shunt-connecting said plurality of first wires.

24. A device according to claim 23, wherein each floating gate electrode and each control gate electrode consists of polysilicon.

25. A device according to claim 23, wherein each floating gate electrode and each control gate electrode consists of polycide film 26. A device according to claim 23, wherein each floating gate electrode and each control gate electrode consists of silicide film.

27. A device according to claim 23, wherein said wires consist of aluminum film.

28. A device according to claim 23, wherein each wires consist of tungsten film.

* * * * *